(12) United States Patent
Ho

(10) Patent No.: US 7,154,308 B2
(45) Date of Patent: Dec. 26, 2006

(54) DRIVER CIRCUIT WITH GRADUAL VOLTAGE RAMP UP AND RAMP DOWN

(75) Inventor: Daniel Ho, Palo Alto, CA (US)

(73) Assignee: Via Technologies, Inc., Taipei (TW)

( * ) Notice: Subject to any disclaimer, the term of this patent is extended or adjusted under 35 U.S.C. 154(b) by 23 days.

(21) Appl. No.: 10/956,290

(22) Filed: Sep. 30, 2004

(65) Prior Publication Data

US 2006/0066363 A1  Mar. 30, 2006

(51) Int. Cl.
*H03K 4/06* (2006.01)
*H03B 1/00* (2006.01)

(52) U.S. Cl. ..................... 327/108; 327/131
(58) Field of Classification Search ........ 327/126–127, 327/133–134, 104, 142
See application file for complete search history.

(56) References Cited

U.S. PATENT DOCUMENTS

| | | | |
|---|---|---|---|
| 6,066,976 A * | 5/2000 | Cho ........................ | 327/350 |
| 6,194,941 B1 * | 2/2001 | Zarabadi et al. ............ | 327/307 |
| 6,600,365 B1 * | 7/2003 | Frith ......................... | 330/51 |
| 6,788,156 B1 * | 9/2004 | Tam et al. .................. | 331/49 |
| 6,876,697 B1 * | 4/2005 | Peters et al. ............... | 375/222 |
| 6,961,385 B1 * | 11/2005 | Plisch et al. ............... | 375/259 |
| 2005/0025322 A1 * | 2/2005 | Henson et al. ............. | 381/120 |
| 2005/0135502 A1 * | 6/2005 | Zhang et al. ............... | 375/297 |

OTHER PUBLICATIONS

U.S. Appl. No. 10/862,917, filed Jun. 7, 2004.

* cited by examiner

*Primary Examiner*—My-Trang Nu Ton
(74) *Attorney, Agent, or Firm*—Hickman Palermo Truong & Becker LLP

(57) ABSTRACT

A driver circuit is disclosed comprising an amplifier, a data DAC, and a voltage control mechanism (VCM). During a power up sequence, the VCM provides gradually increasing voltage signals to the amplifier to cause a voltage at the output of the amplifier to increase gradually. During a power down sequence, the VCM provides gradually decreasing voltage signals to the amplifier to causes the voltage at the output of the amplifier to decrease gradually. By gradually increasing and decreasing the voltage at the output of the amplifier in this way, pop noise caused by a rapid change in voltage can be reduced or even eliminated.

32 Claims, 3 Drawing Sheets

DRIVER CIRCUIT WITH GRADUAL VOLTAGE RAMP UP AND RAMP DOWN

FIELD OF THE INVENTION

This invention relates generally to electronic circuits, and more particularly, to a driver circuit with gradual voltage ramp up during a power up sequence and gradual voltage ramp down during a power down sequence.

BACKGROUND

Audio driver circuits are used in many of today's electronic devices (e.g. cell phones, portable music players, etc.) to drive sound producing devices (SPD), such as speakers. Typically, an audio driver circuit comprises a digital-to-analog converter (DAC) and an amplifier. The DAC receives digital signals (representing, for example, music, speech, or other sounds) and converts them into analog signals. The analog signals are then amplified by the amplifier and provided to the SPD to cause the SPD to produce sounds that correspond to the digital signals.

A phenomenon that has been observed with current audio driver circuits is that during the power up and/or power down sequences, a "pop" noise is often produced by the SPD. This pop noise is caused by the rapid change in voltage at the output of the audio driver circuit's amplifier. Because this pop noise is often annoying to users and can sometimes cause damage to sensitive components, eliminating this noise is an objective of many audio driver circuits.

One technique that has been used to eliminate the pop noise is to employ a large capacitor between the output of the DAC and the input of the amplifier. This capacitor has the effect of introducing a long time constant, which slows down the ramp up and ramp down of the common mode voltage at the output of the amplifier, thereby eliminating or at least reducing the pop noise.

While this approach is effective for reducing pop noise, it has a number of practical drawbacks. The first drawback is increased cost. This approach requires the use of a relatively large capacitor. Such large capacitors cannot be fabricated on a semiconductor chip. Thus, the capacitor cannot be incorporated onto the chip on which the audio driver circuit is fabricated, which means that the capacitor has to be implemented as an external (i.e. off-chip) discrete capacitor. The use of external discrete components significantly increases cost. Another drawback, which flows from the fact that the capacitor has to be implemented off-chip, is that the implementation requires more board space. In small electronic devices, board space is very scarce, and many devices may not have enough board space to accommodate the capacitor. Thus, this approach may not even be implementable. Yet another drawback, which also flows from the fact that the capacitor has to be implemented off-chip, is that the chip on which the audio driver circuit is fabricated has to have an additional pin for accommodating the off-chip capacitor. In many applications, pin count is constrained and adding a pin just for the off-chip capacitor is not an option. Thus, this approach may again not be implementable.

In view of the above drawbacks, an improved approach for eliminating/reducing pop noise is needed.

SUMMARY

In accordance with one embodiment of the present invention, there is provided an improved driver circuit, which enables voltage ramp up and voltage ramp down to be achieved gradually without the use of an external capacitor. If the driver circuit is used to drive an SPD, pop noise can be significantly reduced and even eliminated during the power up and power down sequences.

In one embodiment, the driver circuit comprises an amplifier, a data DAC, and a voltage control mechanism (VCM). The amplifier has one or more inputs for receiving one or more analog signals, and an output for providing an amplified analog signal. The data DAC has one or more inputs for receiving digital data signals, and one or more outputs for providing one or more analog signals corresponding to the digital data signals. The one or more outputs of the data DAC are controllably coupled to the one or more inputs of the amplifier. The VCM has one or more outputs controllably coupled to the one or more inputs of the amplifier.

In operation, when a power up sequence is initiated, the VCM is coupled to the amplifier, and the data DAC is decoupled from the amplifier. During the power up sequence, the VCM provides gradually increasing voltage signals to the one or more inputs of the amplifier. These gradually increasing voltage signals are amplified by the amplifier, and cause a voltage at the output of the amplifier to increase gradually. This continues until the voltage at the output of the amplifier reaches a certain desired operating voltage. At that point, the data DAC is coupled to the amplifier, and the VCM is decoupled from the amplifier. The driver circuit is thus ready for steady state operation.

During steady state, the data DAC receives digital data signals (representing, for example, music, speech, or other sounds) and converts them into one or more analog signals, which are passed on to the amplifier. Upon receiving the analog signal(s) from the data DAC, the amplifier amplifies the analog signal(s) and provides an amplified voltage at its output, which can be used to drive an external device, such as an SPD. This steady state operation continues until a power down sequence is initiated.

When a power down sequence is initiated, the VCM is again coupled to the amplifier and the data DAC is decoupled from the amplifier. During the power down sequence, the VCM provides gradually decreasing voltage signals to the one or more inputs of the amplifier. These gradually decreasing voltage signals are amplified by the amplifier, and cause the voltage at the output of the amplifier to decrease gradually from the steady state operating voltage to substantially ground. When the voltage at the output of the amplifier reaches substantially ground, the VCM is decoupled from the amplifier and the amplifier is allowed to be turned off. By increasing and decreasing the voltage at the output of the amplifier gradually in this manner, the VCM is able to reduce/prevent any pop noise from occurring when the driver circuit is powered on or powered off.

DETAILED DESCRIPTION OF EMBODIMENT(S)

Functional Overview

Figure 1:
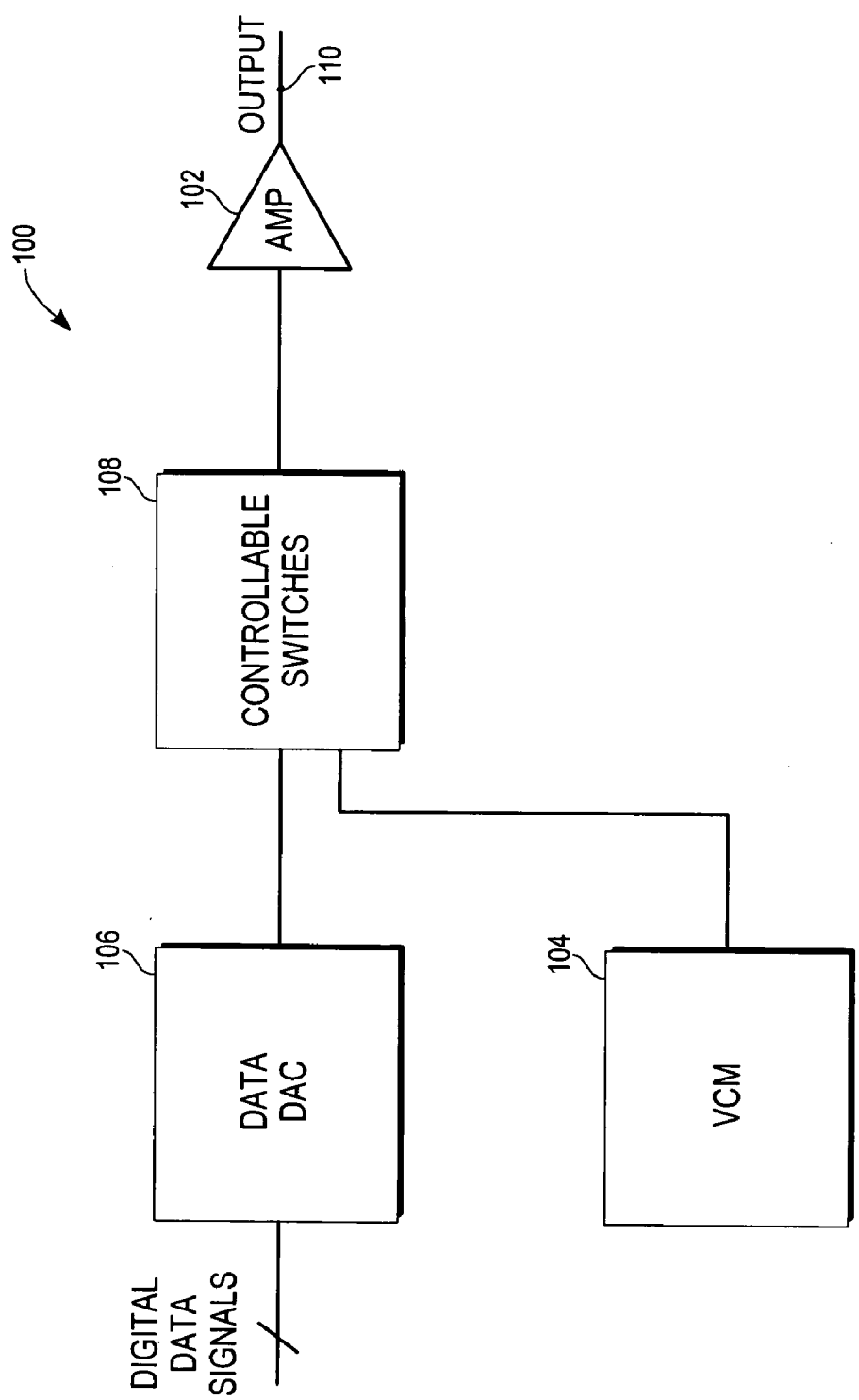
FIG. 1 is a functional diagram of a driver circuit in accordance with one embodiment of the present invention.

With reference to FIG. 1, there is shown a functional diagram of a driver circuit in accordance with one embodiment of the present invention. As shown, the driver circuit 100 comprises an amplifier 102, a voltage control mechanism (VCM) 104, and a data DAC 106. The VCM 104 and the data DAC 106 are controllably coupled to the amplifier 102 via a set of controllable switches 108.

The driver circuit 100 may be used for many possible purposes, one of which is to drive an SPD (not shown), such as a speaker. When used for such purpose, the driver circuit 100 can cause little or no pop noise to be produced during power up and power down sequences. In one embodiment, the driver circuit 100 achieves this result by gradually ramping up and gradually ramping down the voltage at the output 110 of the amplifier 102 during the power up and power down sequences.

In operation, when a power up sequence is initiated, the switches 108 couple the VCM 104 to the input of the amplifier 102, and decouple the data DAC 106 from the input of the amplifier 102. The VCM 104 then provides gradually increasing voltage signals to the input of the amplifier 102. These signals are amplified by the amplifier 102, and the amplified output is provided at the amplifier's output 110. Because the voltage signals at the input of the amplifier 102 are increased gradually, the voltage at the output 110 of the amplifier 102 is also increased gradually. In one embodiment, the output voltage is increased gradually enough that little or no pop noise is produced during the power up sequence. This gradual increase of the output voltage is continued until the output voltage reaches a certain desired operating voltage (common mode voltage). At that point, the switches 108 couple the data DAC 106 to the input of the amplifier 102, and decouple the VCM 104 from the amplifier 102. The driver circuit 100 is now ready for steady state operation.

During steady state, the data DAC 106 receives digital data signals (representing, for example, music, speech, or other sounds) and converts them into analog signals. The analog signals are passed on to the amplifier 102, which then amplifies them, providing an amplified signal at its output 110. This output signal can then be used to drive an external device, such as an SPD. This steady state operation continues until a power down sequence is initiated.

When a power down sequence is initiated, the VCM 104 is again coupled (by switches 108) to the input of the amplifier 102, and the data DAC 106 is decoupled (by the switches 108) from the input of the amplifier 102. The VCM 104 then provides gradually decreasing voltage signals to the input of the amplifier 102. These gradually decreasing voltage signals cause the voltage at the output 110 of the amplifier 102 to gradually decrease from the operating voltage (common mode voltage) to substantially ground. In one embodiment, the output voltage is decreased gradually enough that little or no pop noise is produced during the power down sequence. When the output voltage reaches substantially ground, the switches 108 decouple the VCM 104 from the amplifier 102, and the amplifier 102 is allowed to be turned off.

By increasing and decreasing the voltage at the output 110 of the amplifier 102 gradually in the manner discussed above, the VCM 104 is able to reduce and/or even prevent any pop noise from occurring when the driver circuit 100 is powered up and/or powered down.

Sample Implementation

Figure 2:
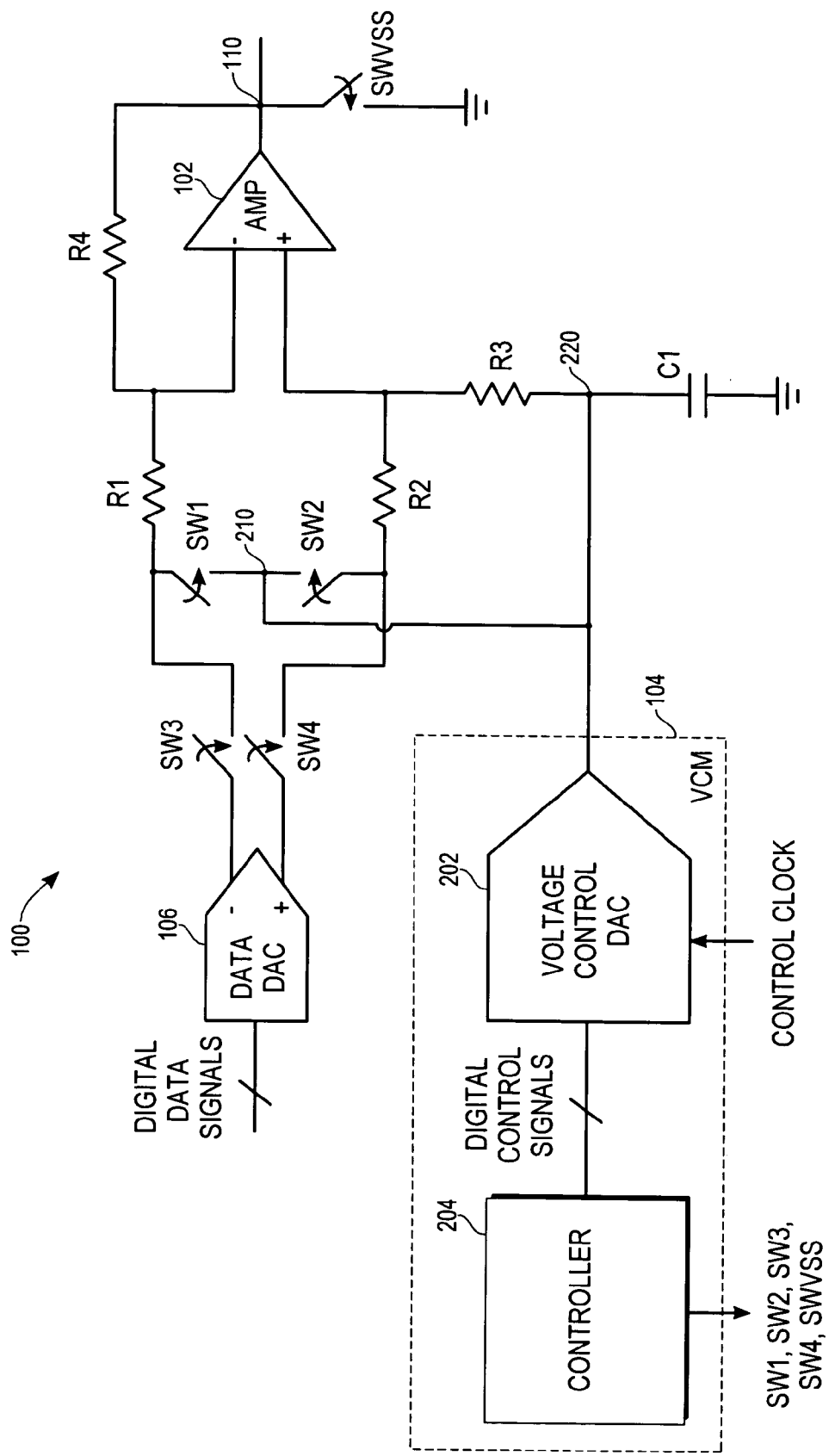
FIG. 2 is a circuit diagram of the driver circuit of FIG. 1, in accordance with one embodiment of the present invention.

FIG. 2 shows one possible implementation of the driver circuit 100 of FIG. 1. In the sample implementation of FIG. 2, the controllable switches 108 of FIG. 1 are implemented by switches SW1, SW2, SW3, and SW4, and the VCM 104 is implemented with a voltage control DAC 202 and a controller 204. This is just one potential implementation of the VCM 104. Other implementations are possible and are within the scope of the present invention. Generally, any mechanism that is capable of providing gradually increasing and/or gradually decreasing voltage signals may be used as the VCM 104. In one embodiment, all of the components shown in FIG. 2 may be implemented on one or more semiconductor chips. Thus, no off-chip discrete components are necessary.

Amplifier

As shown in FIG. 2, the driver circuit 100 comprises an amplifier 102. For purposes of the present invention, amplifier 102 may be any type of amplifier that is capable of receiving one or more analog signals at its one or more inputs and providing an amplified analog signal at its output 110. In the sample implementation shown, the amplifier 102 has differential inputs. This is for illustrative purposes only. If so desired, the amplifier 102 may have a single ended input.

In one embodiment, the amplifier 102 is arranged with resistive feedback. As shown in FIG. 2, the output 110 of the amplifier 102 is fed, through resistor R4, back to the negative input of the amplifier 102. This helps to increase the stability of the amplifier 102. In addition to being fed back to the negative input, the output 110 of the amplifier 102 is also coupled by switch SWVSS to ground. The use of this switch will be discussed in a later section.

Data DAC

The driver circuit 100 further comprises a data DAC 106. For purposes of the present invention, any type of DAC and any component capable of converting digital signals into analog signals may be used as data DAC 106. The data DAC 106 has an input for receiving a data clock signal, and one or more digital inputs for receiving digital data signals. The digital data signals may represent anything that is to be converted into analog signals, including but not limited to, music, speech, or any other type of sound. The data DAC 106 converts the digital data signals into corresponding analog signals, and provides the analog signals at its outputs. In the example shown, the data DAC 106 has differential outputs. It should be noted though that this is for illustrative purposes only. If so desired, the data DAC 106 may have a single ended output.

The outputs of the data DAC 106 are controllably coupled to the inputs of the amplifier 102 by switches SW3 and SW4. More specifically, when switches SW3 and SW4 are open, the data DAC 106 is decoupled from the amplifier 102. When switches SW3 and SW4 are closed, the outputs of the data DAC 106 are coupled, through resistors R1 and R2, to the inputs of the amplifier 102. In one embodiment, resistors R1 and R2 have substantially the same resistive value. Once coupled to the amplifier 102, the data DAC 106 is able to pass converted data signals to the amplifier 102 for amplification.

Voltage Control DAC and Controller

The driver circuit 100 further comprises a voltage control DAC 202 and a controller 204 for controlling the operation of the voltage control DAC 202. These components 202, 204 together perform the function of the VCM 104.

For purposes of the present invention, the voltage control DAC 202 may be any type of DAC or any type of component capable of converting digital signals into analog signals. The voltage control DAC 202 has an input for receiving a control clock signal, and one or more digital inputs for receiving digital control signals. In response to the digital control signals, the voltage control DAC 202 outputs corresponding analog signals. In the sample implementation, the voltage control DAC 202 is shown as having a single ended output. It should be noted though that if so desired, the voltage control DAC 202 may be implemented with differential outputs.

The output of the voltage control DAC 202 is controllably coupled to the inputs of the amplifier 102 by switches SW1 and SW2. More specifically, when switches SW1 and SW2 are open, the voltage control DAC 202 is decoupled from the amplifier 102. When switches SW1 and SW2 are closed, the output of the voltage control DAC 202 is coupled, through node 210 and resistors R1 and R2, to the inputs of the amplifier 102. In addition to being coupled to node 210, the output of the voltage control DAC 202 is also coupled to node 220. In turn, node 220 is coupled through capacitor C1 to ground, and through resistor R3 to the positive input of the amplifier 102. In one embodiment, resistors R3 and R4 have substantially the same resistive value. Also, capacitor C1 has a relatively small capacitance. Because it has a small capacitance, capacitor C1 can be fabricated on a semiconductor chip. Hence, it need not be implemented as an off chip discrete component.

As noted previously, one of the purposes of the VCM 104 is to provide to the amplifier 102 gradually increasing voltage signals during a power up sequence, and gradually decreasing voltage signals during a power down sequence. Doing so allows the voltage at the output 110 of the amplifier 102 to ramp up and ramp down slowly, thereby preventing the occurrence of any pop noise. Since voltage control DAC 202 is the component of the VCM 104 that provides the analog signals to the amplifier 102, it is up to the voltage control DAC 202 to provide the gradually increasing and gradually decreasing voltage signals.

To cause the voltage control DAC 202 to output the proper voltage signals, the controller 204 provides the proper digital control signals to the voltage control DAC 202. In one embodiment, the controller 204 provides a series of digital control signals to the voltage control DAC 202 to cause the DAC 202 to output gradually increasing or gradually decreasing voltage signals. To illustrate how this is done, reference will be made to an example.

Figure 3:
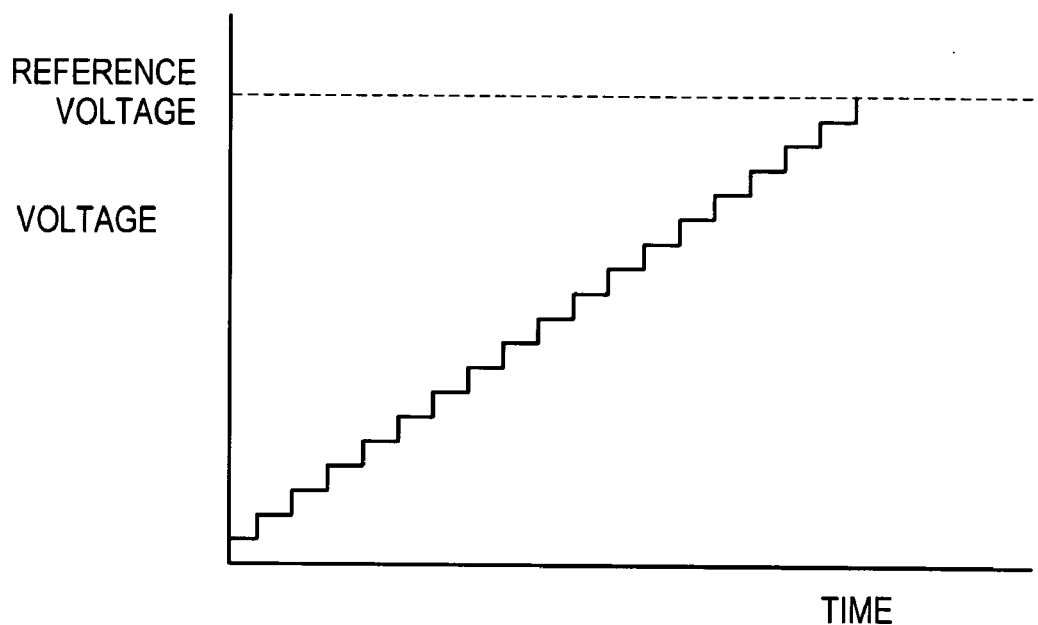
FIG. 3 is a voltage vs. time plot showing the gradual increase in the output voltage of the voltage control DAC of FIG. 2 during a power up sequence.

Suppose that the voltage control DAC 202 is a 6-bit DAC, which receives a 6-bit digital value as input. For such a DAC, a digital input of 000000 will cause the DAC to output the lowest voltage that it can output, and a digital input of 111111 will cause the DAC to output the highest voltage that it can output. To cause the voltage control DAC 202 to output gradually increasing voltage signals, the controller 204 feeds a series of incremented digital inputs to the DAC 202. For example, the controller 204 may start with a small digital input value (e.g. 000001), which will cause the DAC 202 to output a relatively small voltage signal. After a certain period of time, the controller 204 increments the digital input by some desired increment (e.g. to 000011) and sends the incremented digital value to the DAC 202. This will cause the DAC 202 to output a slightly larger voltage signal. After a certain period of time, the controller 204 again increments the digital input, and sends the incremented digital value to the DAC 202. This again will cause the DAC 202 to output a slightly larger voltage signal. By repeatedly incrementing the digital input value, and sending the incremented digital value to the DAC 202, the controller 204 causes the DAC 202 to output a series of gradually increasing voltage signals. This can be seen in FIG. 3, which shows the voltage output of the voltage control DAC 202 over time. If the increments are kept small, the increase in voltage signals will be gradual, as shown. In this way, the controller 204 can cause the voltage control DAC 202 to output gradually increasing voltage signals. At some point, a reference voltage will be reached (this reference voltage may be, for example, the voltage outputted by the voltage control DAC 202 that causes the voltage at the output 110 of the amplifier 102 to reach a desired common mode voltage). When that happens, the controller 204 can stop sending digital control signals to the voltage control DAC 202.

Figure 4:
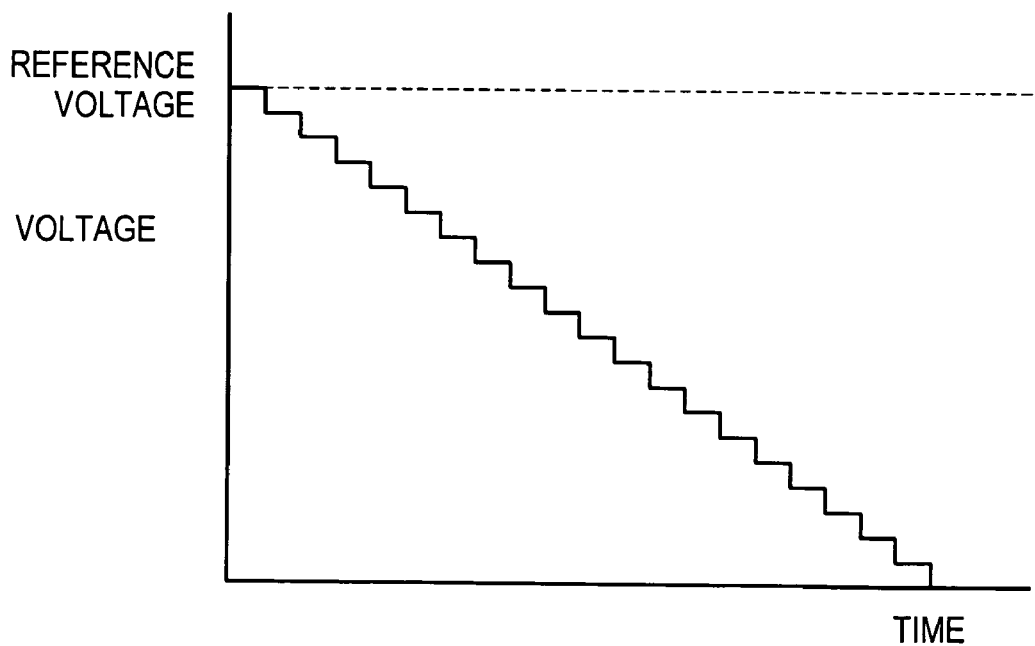
FIG. 4 is a voltage vs. time plot showing the gradual decrease in the output voltage of the voltage control DAC of FIG. 2 during a power down sequence.

The controller 204 can cause the voltage control DAC 202 to output gradually decreasing voltage signals in a similar way. Specifically, the controller 204 can start by sending a relatively large digital value to the voltage control DAC 202 (for example, this value can be the value that causes the voltage control DAC 202 to output the reference voltage). In response, the voltage control DAC 202 will output a relatively large voltage signal. After a certain period of time, the controller 204 decrements the digital input by some desired decrement, and sends the decremented digital value to the DAC 202. This will cause the DAC 202 to output a slightly smaller voltage signal. After a certain period of time, the controller 204 again decrements the digital input, and sends the decremented digital value to the DAC 202. This again will cause the DAC 202 to output a slightly smaller voltage signal. By repeatedly decrementing the digital input value, and sending the decremented digital value to the DAC 202, the controller 204 causes the DAC 202 to output a series of gradually decreasing voltage signals, as shown in FIG. 4. If the decrements are kept small, the decrease in voltage signals will be gradual, as shown. In this way, the controller 204 causes the voltage control DAC 202 to output gradually decreasing voltage signals.

In one embodiment, in addition to controlling the voltage control DAC 202, the controller also controls SW1, SW2, SW3, SW4, and SWVSS. The operation of the controller 204 will be discussed in a later section.

For purposes of the present invention, the controller 204 may be implemented in a variety of ways. For example, the controller 204 may be implemented as a state machine using hardware logic components. The controller 204 may also be implemented as a digital signal processor. In addition, the controller 204 may be implemented with one or more processors executing one or more sets of instructions. These and all other possible implementations are within the scope of the present invention.

SAMPLE OPERATION

With reference to the circuit diagram of FIG. 2, a sample operation of the driver circuit 100 in accordance with one embodiment of the present invention will now be described.

Power Up Sequence

When a power up sequence is initiated (for example, by a user), the controller 204 receives a power up signal. In response, the controller 204 closes switches SW1 and SW2 to couple the output of the voltage control DAC 202 to the inputs of the amplifier 102, and opens switches SW3 and SW4 (if they are not already open) to decouple the outputs of the data DAC 106 from the inputs of the amplifier 102. The amplifier 102 is then powered on. Initially, the switch SWVSS is closed so that the output 110 of the amplifier 102 is grounded. After the amplifier 102 is powered on, the controller 204 opens switch SWVSS to un-ground the output 110.

The controller 204 then sends a series of progressively incremented digital control signals to the voltage control DAC 202 (in the manner described previously) to cause the voltage control DAC 202 to output a series of gradually increasing voltage signals to the inputs of the amplifier 102. These signals are amplified by the amplifier 102, and the amplified signals are provided at the output 110 of the amplifier 102. Because the voltage signals at the inputs of the amplifier 102 are increased gradually, the voltage at the output 110 of the amplifier 102 is also increased gradually. In one embodiment, the output voltage of the amplifier 102 is increased gradually enough that little or no pop noise is produced during the power up sequence. This gradual increase of the output voltage of the amplifier 102 is continued until the output voltage reaches a certain desired operating voltage (common mode voltage). At that point, the controller 204 closes switches SW3 and SW4 to couple the outputs of the data DAC 106 to the inputs of the amplifier 102, and opens switches SW1 and SW2 to decouple the output of the voltage control DAC 202 from the inputs of the amplifier 102. The data DAC 106 is then powered on. The driver circuit 100 is now ready for steady state operation.

Steady State Operation

During steady state, the data DAC 106 receives digital data signals and converts them into analog signals. The analog signals are passed from the outputs of the data DAC 106 to the inputs of the amplifier 102. The amplifier 102 amplifies the analog signals and provides amplified signals at its output 110. These output signals can then be used to drive an external device, such as an SPD. This steady state operation continues until a power down sequence is initiated.

Power Down Sequence

When a power down sequence is initiated (for example, by a user), the controller 204 receives a power down signal. In response, the controller 204 closes switches SW1 and SW2 to again couple the output of the voltage control DAC 202 to the inputs of the amplifier 102, and opens switches SW3 and SW4 to decouple the outputs of the data DAC 106 from the inputs of the amplifier 102.

The controller 204 then sends a series of progressively decremented digital control signals to the voltage control DAC 202 (in the manner described previously) to cause the voltage control DAC 202 to output a series of gradually decreasing voltage signals to the inputs of the amplifier 102. These signals, which are amplified by the amplifier 102, cause the voltage at the output 110 of the amplifier 102 to gradually drop from the operating voltage (common mode voltage) to substantially ground. Because the voltage signals at the inputs of the amplifier 102 are decreased gradually, the voltage at the output 110 of the amplifier 102 is also decreased gradually. In one embodiment, the output voltage of the amplifier 102 is decreased gradually enough that little or no pop noise is produced during the power down sequence. After the output voltage of the amplifier 102 reaches substantially ground, the controller 204 closes switch SWVSS to ground the output 110 of the amplifier 102. The controller 104 also opens switches SW1 and SW2 to decouple the output of the voltage control DAC 202 from the inputs of the amplifier 102. Once that is done, the amplifier 102, data DAC 106, and voltage control DAC 202 can be turned off. The power down sequence is thus complete.

At this point, it should be noted that although the invention has been described with reference to a specific embodiment, it should not be construed to be so limited. Various modifications may be made by those of ordinary skill in the art with the benefit of this disclosure without departing from the spirit of the invention. Thus, the invention should not be limited by the specific embodiments used to illustrate it but only by the scope of the issued claims.

What is claimed is:

1. A driver circuit, comprising:
    an amplifier having one or more inputs and an output;
    a voltage control mechanism (VCM) having one or more outputs controllably coupled to the one or more inputs of the amplifier, the VCM providing gradually increasing voltage signals to the amplifier during a power up sequence to cause a voltage at the output of the amplifier to increase gradually; and
    a data digital-to-analog converter (DAC) having one or more inputs for receiving digital data signals and one or more outputs for providing one or more analog signals corresponding to the digital data signals, wherein the one or more outputs of the data DAC are controllably coupled to the one or more inputs of the amplifier.

2. The driver circuit of claim 1, further comprising: one or more controllable switches for controllably coupling the one or more outputs of the VCM to the one or more inputs of the amplifier, and for controllably coupling the one or more outputs of the data DAC to the one or more inputs of the amplifier.

3. The driver circuit of claim 1, wherein the one or more outputs of the VCM are coupled to the one or more inputs of the amplifier during the power up sequence and decoupled therefrom during steady state operation.

4. The driver circuit of claim 1, wherein the one or more outputs of the data DAC are coupled to the one or more inputs of the amplifier during steady state operation and decoupled therefrom while the VCM is providing gradually increasing voltage signals to the amplifier during the power up sequence.

5. The driver circuit of claim 1, wherein the VCM provides gradually decreasing voltage signals to the amplifier during a power down sequence to cause the voltage at the output of the amplifier to decrease gradually.

6. The driver circuit of claim 5, wherein the one or more outputs of the VCM are decoupled from the one or more inputs of the amplifier during steady state operation and coupled thereto during the power down sequence.

7. The driver circuit of claim 5, wherein the one or more outputs of the data DAC are coupled to the one or more inputs of the amplifier during steady state operation and decoupled therefrom while the VCM is providing gradually decreasing voltage signals to the amplifier during the power down sequence.

8. The driver circuit of claim 1, wherein the VCM comprises:
    a voltage control DAC having one or more inputs for receiving digital control signals and one or more outputs for providing one or more analog signals corresponding to the digital control signals, wherein the one or more outputs of the voltage control DAC are controllably coupled to the one or more inputs of the amplifier; and a controller coupled to the one or more inputs of the voltage control DAC, the controller providing, during a power up sequence, a first series of digital control signals to the voltage control DAC to cause the voltage control DAC to output gradually increasing voltage signals.

9. The driver circuit of claim 8, wherein the controller provides, during a power down sequence, a second series of digital control signals to the voltage control DAC to cause the voltage control DAC to output gradually decreasing voltage signals.

10. The driver circuit of claim 9, wherein the controller is a state machine implemented with hardware logic components.

11. The driver circuit of claim 9, wherein the controller comprises one or more processors executing one or more sets of instructions.

12. The driver circuit of claim 9, wherein the controller comprises a digital signal processor.

13. The driver circuit of claim 9, further comprising one or more controllable switches for controllably coupling the one or more outputs of the voltage control DAC to the one or more inputs of the amplifier, and for controllably coupling the one or more outputs of the data DAC to the one or more inputs of the amplifier.

14. The driver circuit of claim 13, wherein the one or more controllable switches are controlled by the controller.

15. A driver circuit, comprising:
an amplifier having one or more inputs and an output;
a data digital-to-analog converter (DAC) having one or more inputs for receiving digital data signals and one or more outputs for providing one or more analog signals corresponding to the digital data signals, wherein the one or more outputs of the data DAC are controllably coupled to the one or more inputs of the amplifier;
a voltage control DAC having one or more inputs for receiving digital control signals and one or more outputs for providing one or more analog signals corresponding to the digital control signals, wherein the one or more outputs of the voltage control DAC are controllably coupled to the one or more inputs of the amplifier; and
a controller coupled to the one or more inputs of the voltage control DAC, wherein the controller provides, during a power up sequence, a series of digital control signals to the voltage control DAC to cause the voltage control DAC to output a series of gradually increasing voltage signals to the amplifier, the series of gradually increasing voltage signals causing a voltage at the output of the amplifier to increase gradually.

16. The driver circuit of claim 15, wherein the driver circuit is used to drive a sound producing device, and wherein the voltage at the output of the amplifier increases sufficiently gradually that substantially no audible pop noise is produced by the sound producing device during the power up sequence.

17. The driver circuit of claim 15, further comprising:
one or more controllable switches for controllably coupling the one or more outputs of the voltage control DAC to the one or more inputs of the amplifier, and for controllably coupling the one or more outputs of the data DAC to the one or more inputs of the amplifier.

18. The driver circuit of claim 17, wherein the controller controls the one or more controllable switches.

19. The driver circuit of claim 18, wherein the controller causes the one or more controllable switches to couple the one or more outputs of the voltage control DAC to the one or more inputs of the amplifier during the power up sequence, and to decouple the one or more outputs of the voltage control DAC from the one or more inputs of the amplifier during steady state operation.

20. The driver circuit of claim 19, wherein the controller causes the one or more controllable switches to decouple the one or more outputs of the data DAC from the one or more inputs of the amplifier while the voltage control DAC is outputting the series of gradually increasing voltage signals to the amplifier, and to couple the one or more outputs of the data DAC to the one or more inputs of the amplifier during steady state operation.

21. The driver circuit of claim 18, wherein the controller is a state machine implemented with hardware logic components.

22. The driver circuit of claim 18, wherein the controller comprises one or more processors executing one or more sets of instructions.

23. The driver circuit of claim 18, wherein the controller comprises a digital signal processor.

24. A driver circuit, comprising:
an amplifier having one or more inputs and an output;
a data digital-to-analog converter (DAC) having one or more inputs for receiving digital data signals and one or more outputs for providing one or more analog signals corresponding to the digital data signals, wherein the one or more outputs of the data DAC are controllably coupled to the one or more inputs of the amplifier;
a voltage control DAC having one or more inputs for receiving digital control signals and one or more outputs for providing one or more analog signals corresponding to the digital control signals, wherein the one or more outputs of the voltage control DAC are controllably coupled to the one or more inputs of the amplifier; and
a controller coupled to the one or more inputs of the voltage control DAC, wherein the controller provides, during a power down sequence, a series of digital control signals to the voltage control DAC to cause the voltage control DAC to output a series of gradually decreasing voltage signals to the amplifier, the series of gradually decreasing voltage signals causing a voltage at the output of the amplifier to decrease gradually.

25. The driver circuit of claim 24, wherein the driver circuit is used to drive a sound producing device, and wherein the voltage at the output of the amplifier decreases sufficiently gradually that substantially no audible pop noise is produced by the sound producing device during the power down sequence.

26. The driver circuit of claim 24, further comprising:
one or more controllable switches for controllably coupling the one or more outputs of the voltage control DAC to the one or more inputs of the amplifier, and for controllably coupling the one or more outputs of the data DAC to the one or more inputs of the amplifier.

27. The driver circuit of claim 26, wherein the controller controls the one or more controllable switches.

28. The driver circuit of claim 27, wherein the controller causes the one or more controllable switches to couple the one or more outputs of the voltage control DAC to the one or more inputs of the amplifier during the power down sequence, and to decouple the one or more outputs of the voltage control DAC from the one or more inputs of the amplifier during steady state operation.

29. The driver circuit of claim 28, wherein the controller causes the one or more controllable switches to couple the one or more outputs of the data DAC to the one or more inputs of the amplifier during steady state operation, and to decouple the one or more outputs of the data DAC from the one or more inputs of the amplifier while the voltage control DAC is outputting the series of gradually decreasing voltage signals to the amplifier.

30. The driver circuit of claim 27, wherein the controller is a state machine implemented with hardware logic components.

31. The driver circuit of claim 27, wherein the controller comprises one or more processors executing one or more sets of instructions.

32. The driver circuit of claim 27, wherein the controller comprises a digital signal processor.

* * * * *